(12) United States Patent
Chiu et al.

(10) Patent No.: US 12,512,433 B2
(45) Date of Patent: Dec. 30, 2025

(54) SEMICONDUCTOR STRUCTURES AND METHODS FOR MANUFACTURING THE SAME

(71) Applicant: TAIWAN SEMICONDUCTOR MANUFACTURING COMPANY, LTD., Hsinchu (TW)

(72) Inventors: Chih-Pin Chiu, Hsinchu (TW); Liang-Wei Wang, Hsinchu (TW); Chen-Chiu Huang, Taichung (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 733 days.

(21) Appl. No.: 17/575,124

(22) Filed: Jan. 13, 2022

(65) Prior Publication Data

US 2023/0025412 A1    Jan. 26, 2023

Related U.S. Application Data

(60) Provisional application No. 63/225,336, filed on Jul. 23, 2021.

(51) Int. Cl.
*H01L 23/00* (2006.01)

(52) U.S. Cl.
CPC .............. *H01L 24/29* (2013.01); *H01L 24/27* (2013.01); *H01L 2224/29008* (2013.01); *H01L 2224/29124* (2013.01); *H01L 2224/29144* (2013.01); *H01L 2224/29147* (2013.01); *H01L 2224/29157* (2013.01); *H01L 2224/2916* (2013.01); *H01L 2224/29184* (2013.01); *H01L 2224/29281* (2013.01)

(58) Field of Classification Search
CPC ......... H01L 21/76805; H01L 21/76885; H01L 21/76819; H01L 23/5223; H01L 23/53295; H01L 23/3192; H10D 1/68
See application file for complete search history.

(56) References Cited

U.S. PATENT DOCUMENTS

| 2020/0006183 | A1* | 1/2020 | Huang | ............ H01L 24/08 |
| 2021/0005595 | A1* | 1/2021 | Chen | ............ H01L 21/76898 |
| 2021/0098400 | A1* | 4/2021 | Shen | ............ H01L 24/13 |
| 2021/0375748 | A1* | 12/2021 | Huang | ............ H01L 23/5223 |

* cited by examiner

*Primary Examiner* — Julio J Maldonado
*Assistant Examiner* — Stanetta D Isaac
(74) *Attorney, Agent, or Firm* — STUDEBAKER BRACKETT PLLC

(57) ABSTRACT

Disclosed semiconductor device manufacturing processes improve the flatness of a passivation layer deposited above a redistribution layer (RDL). When a thin passivation layer is deposited above the RDL, its top surface tends to become very uneven due to the large gaps that typically form over the etched portions of the RDL, particularly when the RDL is disposed over an underlying super high density metal-insulator-metal (MIM) capacitor. In order to reduce the incidence of stress concentration areas on the uneven surface, a thicker passivation layer is instead deposited to minimize gap formation therein, and a chemical mechanical planarization (CMP) process is then performed to further smooth the top surface thereof. Reduction of the stress in this manner reduces the incidence of cracking of the underlying MIM, which improves the overall pass rates of semiconductor devices so manufactured.

20 Claims, 10 Drawing Sheets

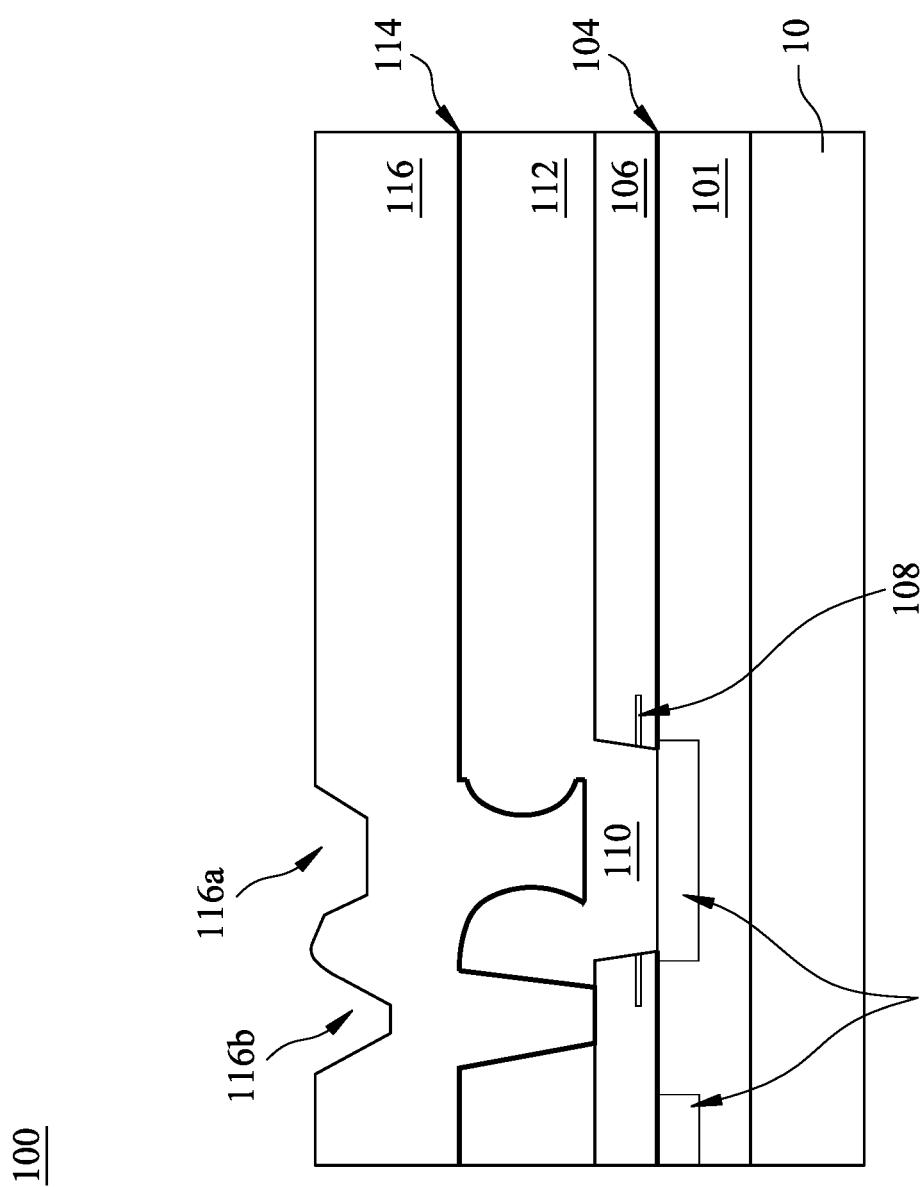

SEMICONDUCTOR STRUCTURES AND METHODS FOR MANUFACTURING THE SAME

CROSS-REFERENCE TO RELATED APPLICATIONS

This application claims priority under 35 U.S.C. § 119(e) to U.S. Provisional Patent Application Ser. No. 63/225,336 entitled "NOVEL PROCESS INTEGRATION OF FLAT PASSIVATION LAYER FOR THE TREATMENT OF PASSIVATION LAYER CRACK AND METAL-INSULATOR-METAL FAILURE" filed on Jul. 23, 2021, the entirety of which is hereby incorporated by reference.

BACKGROUND

Integrated circuits (ICs) are formed on semiconductor dies that include millions or billions of individual semiconductor devices. For example, transistor devices are configured to act as switches, and/or to produce power gains, so as to enable logical functionality for an IC chip (e.g., functionality to perform logic functions). IC chips often also include passive electronic devices, such as capacitors, resistors, inductors and the like. Passive devices are widely used to control chip characteristics (e.g., gain, time constants, and the like) so as to provide an integrated chip with a wide range of different functionalities (e.g., incorporating both analog and digital circuitry on the same die). Capacitors, such as metal-insulator-metal (MIM) capacitors, which include at least a top metal plate and a bottom metal plate separated by an insulating dielectric, are often implemented in ICs.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2 is a cross-sectional view of one of various stages of a sequential fabrication process of a semiconductor device according to some embodiments.

DETAILED DESCRIPTION

Figure 1A:
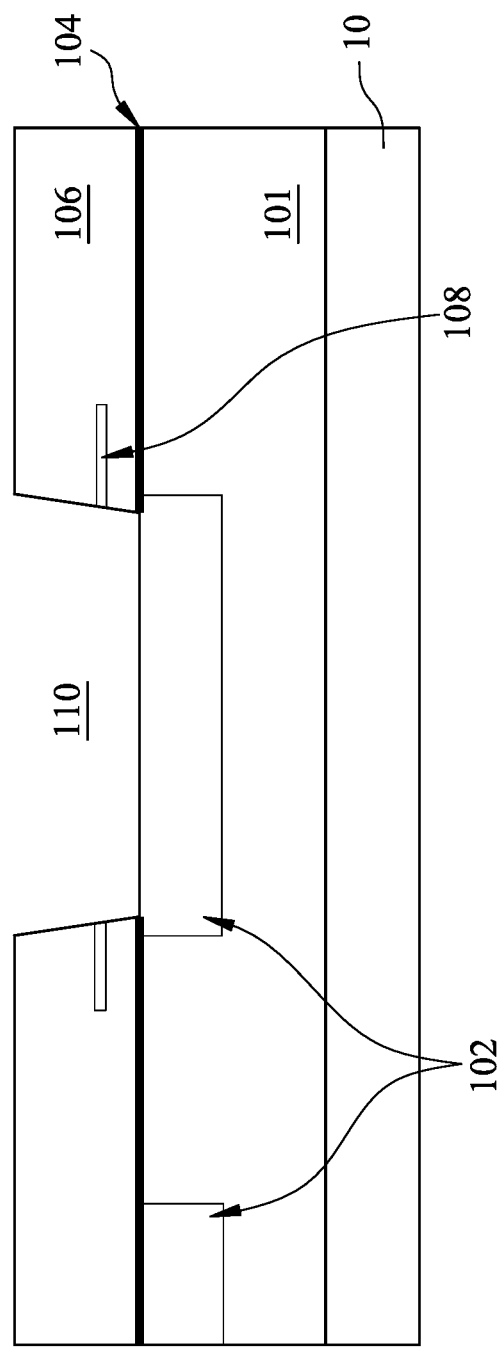
FIG. 1A, FIG. 1B and FIG. 1C are cross-sectional views of one of various stages of a sequential fabrication process of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

One skilled in the art will readily appreciate that each pair of like features shown in cross-section on opposing sides of an opening gap or via are merely artifacts of the cross-sectional view depicted in the Figures. In various embodiments, each such pair of features are actually opposing vertical or near-vertical edges of an otherwise continuous three-dimensional semiconductor feature.

As semiconductor technology evolves, a geometrical size of interconnect structures decreases in order to increase IC density, thereby lowering manufacturing costs and improving device performance. In various embodiments, the interconnect structures include lateral interconnections, such as metal lines (wirings), and vertical interconnections, such as contacts and via plugs. Further, one or more passivation layers are formed to protect the semiconductor device from moisture, etc. One type of semiconductor packaging is a System on Integrated Chip (SoIC) packaging, in which multiple dies are integrated in a single package.

Figure 1B:
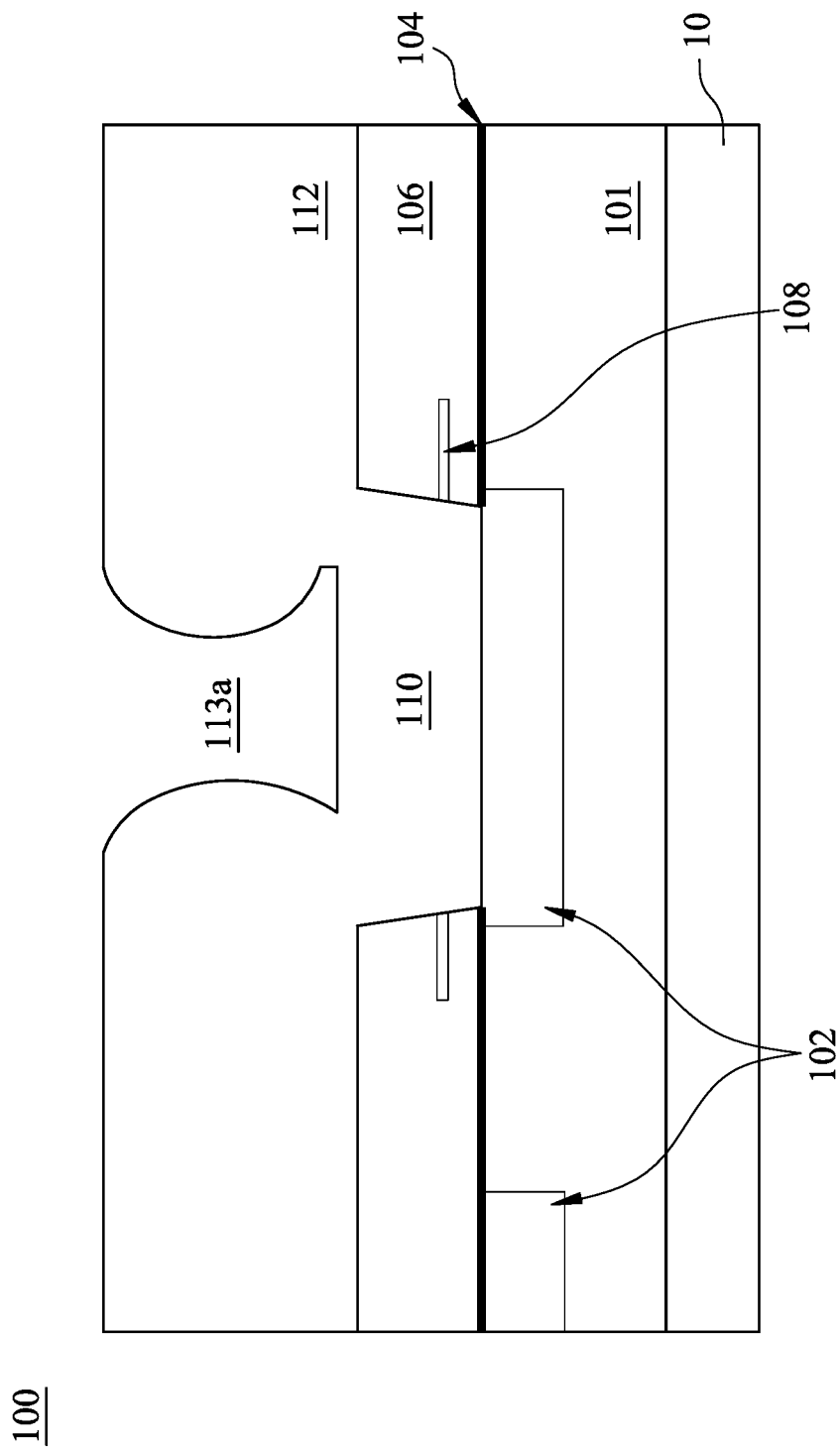
Figure 1C:
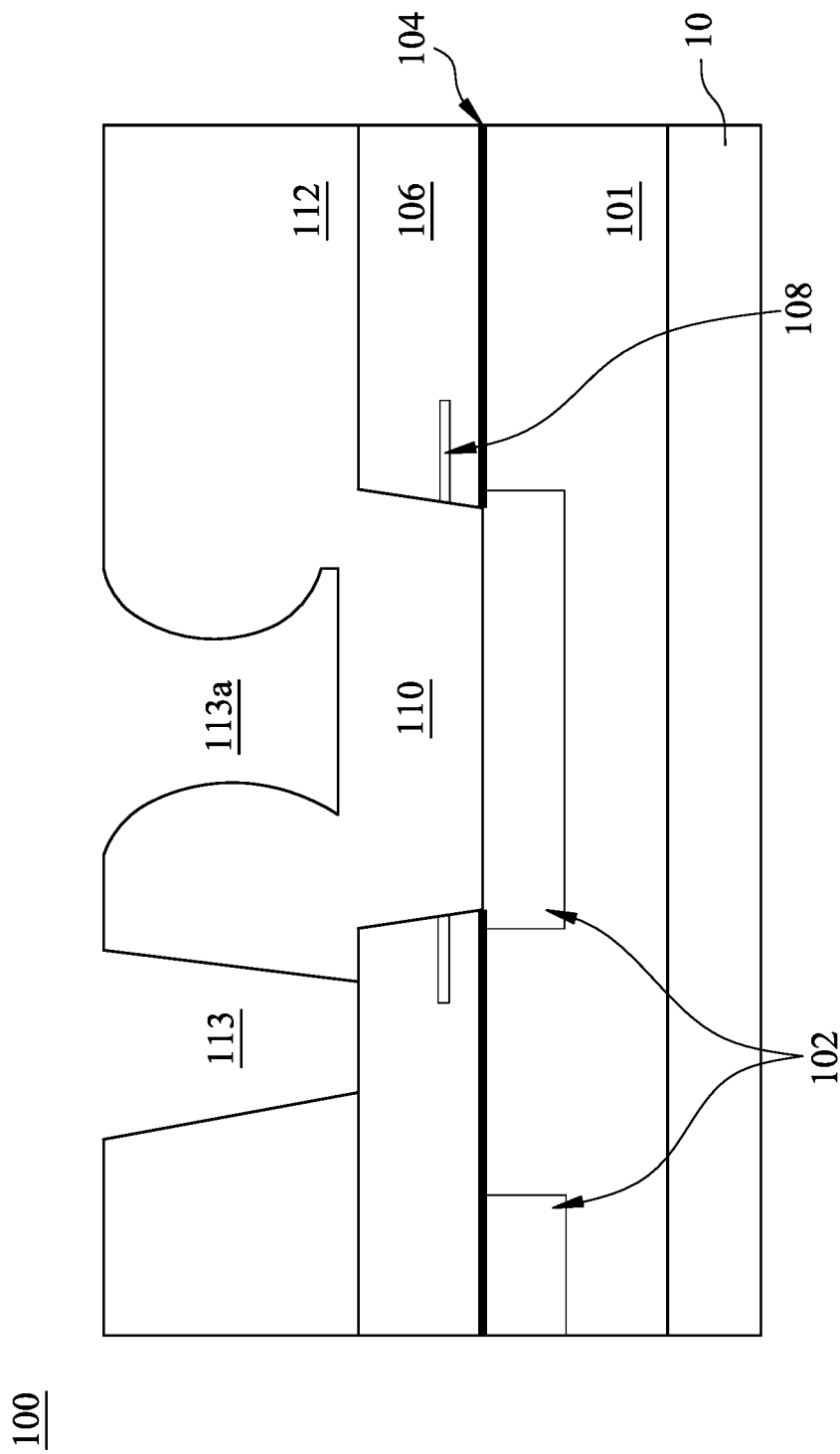

FIG. 1, FIG. 1B and FIG. 1C are cross-sectional views of an initial stage of a sequential fabrication process of a semiconductor device 100 in accordance with various embodiments. As illustrated in the Figures and described herein in various embodiments, the semiconductor device 100 includes a capacitive device, although other types of semiconductor devices of suitable construction are readily contemplated.

Turning to FIG. 1A, in various embodiments, the semiconductor device 100 includes a semiconductor substrate 10, or wafer, which, in various embodiments, is a bulk semiconductor substrate, a semiconductor-on-insulator (SOI) substrate, or another substrate. In various embodiments, the semiconductor material of the semiconductor substrate 10 is doped or undoped, such as with a P-type or an N-type dopant. Other substrates, such as a multi-layered or gradient substrates are also used in various embodiments. In some embodiments, the semiconductor material of the semiconductor substrate 10 may include an elemental semiconductor like silicon (Si) (e.g., crystalline silicon, like Si<100> or Si<111>) and germanium (Ge); or a compound semiconductor including silicon carbide ($Si_xC_y$), gallium arsenide ($Ga_xAs_y$), gallium phosphide ($Ga_xP_y$), indium phosphide ($In_xP_y$), indium arsenide ($In_xAs_y$), and/or indium antimonide ($In_xSb_y$); or an alloy semiconductor including $Si_xGe_y$, $Ga_xAs_yP_z$, aluminum indium arsenide ($Al_xIn_yAs_z$), $Al_xGa_yAs_z$, $Ga_xIn_yAs_z$, $Ga_xIn_yP_z$, $Ga_wIn_xAs_yP_z$ or a combination thereof.

In some embodiments, a plurality of electronic elements, such as transistors, are formed over the substrate 10. Further, in some embodiments, one or more interlayer dielectric (ILD) layer 101 are formed over the electronic elements. Further, a plurality of wiring layers each including wiring patterns and vias connecting wiring layer above and below the given wiring layer. The ILD layer 101 includes dielectric material, such as silicon oxide, silicon nitride, SiON, SiOCN, SiCN, SiCN, a low-k dielectric material, or any other suitable dielectric material.

In various embodiments, a top metal (TM) layer 102 is disposed in one or more sections of the ILD layer 101 near a top surface of the ILD layer 101. In various embodiments, the TM layer 102 has a top surface that is coextensive and coplanar with the top surface of the ILD layer 101. In various embodiments, the top metal layer 102 resides above a transistor or other electrical connection features (not shown). In some embodiments, the top metal layer 102 includes a metal or metal alloy such as copper, cobalt, nickel, aluminum, tungsten, titanium, or combinations thereof. In some embodiments, the top metal layer 102 is formed by a damascene process including deposition or plating of a conductive material, followed by a chemical mechanical planarization (CMP) process. In some embodiments, the TM layer 102 is the topmost conductive layer formed by a damascene process.

In various embodiments, a silicon nitride ($Si_xN_y$) layer 104 is deposited and disposed on the top surfaces of the ILD layer 101 and the TM layer 102 in order to protect the underlying layers during additional processing steps while forming the semiconductor device 100. In some embodiments, a thickness of the silicon nitride layer is in a range from about 10 nm to about 300 nm, and is in a range from about 50 nm to about 100 nm in other embodiments.

A first passivation layer 106 is next deposited and disposed on the top surface of the silicon nitride layer 104. In some embodiments, the first passivation layer 106 may be composed of glass-like material, such as undoped silicate glass (USG), or the like. However, the material of the first passivation layer 106 is not limited thereto, and may include silicon oxide, doped silicate glass, or any other suitable materials. A variety of insulating materials that provide sufficient supporting strength and a low-roughness top surface are also used in various embodiments. In some embodiments, the first passivation layer 106 is formed of two or more separately deposited, coextensive layers of like material to accommodate an intervening structure disposed therebetween. In some embodiments, the first passivation layer 106 has a combined thickness of its one or more layers between about 0.1 micrometers (μm) and about 2 μm, and between about 0.8 μm and about 1.2 μm in other embodiments. In some embodiments, the first passivation layer 106 includes a first layer of USG having a thickness of between about 200 nm and about 300 nm, and between about 225 nm to about 275 nm in other embodiments, and a second layer of USG having a thickness of between about 550 nm and about 750 nm, and between about 600 nm to about 700 nm in other embodiments. In some embodiments, an intervening metal-insulator-metal (MIM) capacitor 108 is disposed between the two layers of the first passivation layer 106.

A MIM capacitor 108 is one type of manufactured capacitor. In various embodiments, MIM capacitors 108 include at least two terminals or conductive plates, with each plate separated by a dielectric insulating layer. In various embodiments, MIM capacitors 108 are useful for storing electric potential energy, voltage regulation, and/or to mitigate noise on an electrical line.

In various embodiments, the MIM capacitor 108 includes a bottom terminal (not shown) and a top terminal (not shown), with an insulating layer disposed there-between. In some embodiments, a material of the bottom terminal and the top terminal includes conductive materials, such as titanium nitride (TiN), titanium (Ti), aluminum (Al), indium tin oxide (ITO), tungsten (W), tungsten nitride (WN), tantalum nitride (TaN), tantalum (Ta), rhenium trioxide ($ReO_3$), rhenium oxide ($ReO_2$), iridium oxide ($IrO_2$), ruthenium (Ru), osmium (Os), palladium (Pd), platinum (Pt), copper (Cu), molybdenum nitride (MoN), molybdenum (Mo), another conductive metal, a combination thereof, or the like. In some embodiments, a thickness of the bottom terminal and the top terminal is between about 0.1 nanometers (nm) and 1 μm, but the present disclosure is not limited thereto. In some embodiments, both the bottom terminal and the top terminal include at least a common overlapping portion, thus forming a capacitor within a capacitance region of the semiconductor device 100.

In some embodiments, the MIM capacitor 108 further includes a high-k dielectric layer that separates the bottom terminal from the top terminal. In some embodiments, the high-k dielectric layer provides a separation spacing between each of these terminals. In some embodiments, the separation spacing between adjacent terminals within the capacitance region is between about 0.1 nm and about 1 μm, in accordance with the thickness of the high-k dielectric layer. In some embodiments, the high-k dielectric layer includes at least one of aluminum oxide ($Al_xO_y$), zirconium oxide ($Zr_xO_y$), silicon nitride ($Si_xN_y$), tantalum nitride ($Ta_xO_y$), titanium oxide ($Ti_xO_y$), strontium titanate ($Sr_xTi_yO_z$), yttrium oxide ($Y_xO_y$), lanthanum oxide ($La_xO_y$), hafnium oxide ($Hf_xO_y$), a multi-layer structure of the combination thereof, or the like.

In some embodiments, the MIM capacitor 108 includes one or more additional terminals and insulating layers disposed between and/or above or below the bottom terminal and the top terminal. In some embodiments, one or more of the terminals of the MIM capacitor 108 are either connected to or isolated from an electrical contact. It should be noted that if the total amount of terminals is more than two, the configuration of the MIM capacitor 108 may be varied accordingly. In some embodiments where the MIM capacitor 108 has at least three terminals, less than all of the terminals are simultaneously connected to the electrical contact.

In various embodiments, one or more terminals of the MIM capacitor 108 are connected with a metal (i.e., aluminum) pad (not shown) to one or more of the TM layer 102 and a redistribution layer (RDL) 112 (described later below) by an intervening redistribution via (RV) 110 having a contact metal deposited and disposed therein. In various embodiments, the RV 110 extends through the first passivation layer 106 and a section of the MIM capacitor 108 for electrically connecting the TM layer 102 with the MIM capacitor 108 using a contact metal disposed within the RV 110. In various embodiments, the RV 110 is formed by etching through the first passivation layer 106 and a section of the MIM capacitor 108 to yield a continuous opening extending from a top surface of the first passivation layer 106 to a top surface of the TM layer 102. In some embodiments, the RV 110 extends through the first passivation layer 106 and tapers linearly from the top surface of the first passivation layer 106 toward the top surface of the TM layer 102, as shown in cross-section in the Figures.

The RV 110 is formed to electrically connect the MIM capacitor 108 and the TM layer 102, using a contact metal deposited therein. In some embodiments, the contact metal is composed of at least one conductive material, such as one or more of aluminum (Al), copper (Cu), aluminum copper (AlCu), gold (Au), tungsten (W), iron (Fe), titanium (Ti), tantalum (Ta), cobalt (Co), tin (Sn) and germanium (Ge), which provide sufficient conductivity at varying material cost. In various embodiments, the conductive material is deposited within the RV 110 using one or more of chemical vapor deposition (CVD), physical vapor deposition (PVD) and electrochemical plating (ECP). In some embodiments, the RV 110 has width of about 1 µm to about 10 µm, depending on design requirements. In some embodiments, the RV 110 has a height of between about 0.1 µm and about 2 µm, depending on design requirements and the height of the first passivation layer 106.

Turning to FIG. 1B, the contact metal of the RV 110 is disposed through the first passivation layer 106 including the MIM capacitor 108, to provide electrical contact with the underlying TM layer 102 and an overlying redistribution layer (RDL) 112. In some embodiments, the RDL 112 is deposited and disposed on the top surface of the passivation layer 106 by CVD, ECP or PVD. In some embodiments, the RDL 112 has a thickness between about 1 µm and around 5 µm over the first passivation layer 106. In some embodiments, the RDL 112 has a width/space (W/S) ratio of between about 1 um/1 um and about 10 um/10 um including all useful ratios there-between that result in a substantially 1:1 relationship. In some embodiments, the RDL 112 is composed of one or more of the following materials: Al, AlCu, Cu, Au, W, Fe, Ti, Ta, Co, Sn, and Ge. In some embodiments, the contact metal of the RV 110 is made of the same material as the RDL 112. In some embodiments, the contact meal is deposited in the RV 110 at the same time and in the same manner as the RDL 112.

In various embodiments, the RDL 112 is deposited as a single continuous layer over the passivation layer 106. Turning to FIG. 1C, in various embodiments, the RDL 112 is then etched in various locations to form one or more trenches 113 that provide electrical isolation in accordance with design requirements, while other portions of the RDL 112 remain un-etched. In some embodiments, some trenches 113a are formed as a results of depositing a blanket layer for the RDL 112 that exists before patterning. In some embodiments, a trench 113a is formed over the RV 110 caused by the opening in the first passivation layer 106 when a blanket layer for the RDL 112 is formed. In some embodiments, a first etched portion of the RDL 112 is disposed over the first passivation layer 106 at a separate location from the RV 110 in accordance with design requirements, such as keep out zone (KOZ) rules. In some such embodiments, in order to reduce non-uniform loading effects, particularly in the active region of active devices, dummy devices are disposed within the KOZ. In various embodiments, a second etched portion of the RDL 112 is disposed over RV 110 as shown in the Figures.

In some embodiments, one or more of the trench 113 and/or trench 113a of the RDL 112 have a rounded shape, resulting in an improved step coverage of subsequent protective layers. Accordingly, defects associated with the trench-filling processes of such protective layers are reduced, in such embodiments. In some embodiments, the rounded shape of the RDL structure is formed by a straining of the underlying first passivation layer 106. In some embodiments, the rounded shape is formed by trimming a shape of a mask layer. In some embodiments, a dimension of the rounded shape is further reduced by a combination of the strained passivation layer and mask layer trimming. In some embodiments, after the formation of the strained first passivation layer 106, the rounded shaped is adjusted by a curing process.

With smaller process geometries required in manufacturing, more defects (such as voids) are generated within the rounded sidewalls of the RDL 112 and between the resulting RDL structures. Voids weaken the mechanical strength of the semiconductor device 100 and are susceptible to being filled during subsequent deposition processes, in various embodiments, which changes the electrical properties of the RDL 112. Therefore, the production yield is sensitive to subsequent trench-filling processes.

FIG. 2 is a cross-sectional view of a subsequent stage of a sequential fabrication process of the semiconductor device 100 according to various embodiments, in which one or more protective layers are first deposited and disposed on the RDL 112 for reducing moisture and delamination, in order to reduce an overall chip rejection rate. In various embodiments, the semiconductor device 100 includes an etch stop layer (ESL) 114 on the RDL 112. The etch stop layer 114 may include silicon nitride ($Si_xN_y$), or the like.

In some embodiments, the ESL 114 has a thickness between about 0.2 nm to about 2 µm. The ESL 114 includes silicon oxynitride ($SiO_xN_y$), silicon carbonitride (SiCN), silicon oxycarbide (SiOC), silicon carbide (SiC), silicon oxycarbonitride (SiOCN), or silicon nitride ($SiN_x$), or combinations thereof, in some embodiments. In some embodiments, the ESL layer 114 includes a first layer of SiON for adhesion with a thickness between about 0.1 nm and about 1 µm and a second layer acting as an etch stop layer and composed of at least one of silicon oxide (SiO), Ge, Al, $SiN_x$, Si, silver (Ag), chromium oxide (CrO), and $SiO_xN_y$ having a thickness between about 0.1 nm and about 1 µm.

In some embodiments, the ESL layer 114 is disposed between the RDL 112 and a second passivation layer 116. In some embodiments, the second passivation layer is deposited and disposed on a top surface of the ESL layer 114 above the RDL 112, as well as in the trenches 113, 113a formed in the RDL 112, thus providing for trench fill. Accordingly, in various embodiments, the second passivation layer 116 inherits an uneven top surface pattern as a result of this trench fill. In various embodiments, an uneven top surface of the second passivation layer 116 readily forms stress concentration areas that induce cracking of the underlying layers, especially after curing and cooling, due to the large difference of coefficient of thermal expansion (CTE) between the different materials of the various layers.

Along the path of device miniaturization, MIM capacitors 108, and in particular, super high density MIM (SHD-MIM) capacitors may suffer from delamination or cracking due to stress concentration incurred by external forces and cracking of the overlying RDL 112 and the first passivation layer 106.

Specifically, a high-k dielectric layer between the terminals, or a high-k dielectric layer above the MIM capacitor, or a high-k dielectric layer adjacent to the RV 110 may suffer from delamination, void induction, cracking and/or defect induction. A crack of the first passivation layer 106 will, in some instances, further damage the MiM capacitor 108, in turn causing wafer acceptance test (WAT) failure. Generally, large or deep trenches 113, 113a in the etched portions of the RDL 112 cause an uneven top surface after the deposition of second passivation layer 116. This uneven surface of the second passivation layer 116 would form stress concentration areas that cause cracking during subsequent deposition, curing and cooling processes.

In order to prevent such failures, a process of forming the second passivation layer 116 is introduced to flatten a flat top surface of the second passivation layer 116, thus reducing the residual stresses during subsequent film depositing, curing and cooling. With reduced cracking of the second passivation layer 116 and the underlying layers, the process window of the semiconductor device 100 is enlarged and the semiconductor device 100 becomes more robust, without significantly making the manufacture of the semiconductor device 100 more complicated.

In various embodiments, the second passivation layer 116 is disposed and deposited on the etch stop layer 114. In such embodiments, the second passivation layer 116 is thus formed above the RDL 112 as well. In some embodiments, a material of the second passivation layer 116 is similar to the material of the first passivation layer 106, such as USG, plasma enhanced deposited oxide, or the like. In some embodiments, the second passivation layer 116 is composed of a High Density Plasma (HDP) oxide, tetraethyl orthosilicate (TEOS), USG, a silicon nitride or a combination thereof.

In some embodiments, a top surface of the second passivation layer 116 is substantially parallel to both the top surface of the first passivation layer 106 and a top surface of the unetched portion of the RDL 112. In some embodiments, in order to provide sufficient mechanical strength to support the structure, a thickness of the second passivation layer 116 (measured from a top surface of the ESL 114 to a top surface of the second passivation layer 116) is initially between about 10 μm and about 20 μm depending on the deposition levels of the HDP oxide, USG or the like. In various embodiments, a chemical mechanical planarization (CMP) process is later employed to planarize the top surface of the second passivation layer 116. The thickness of second passivation layer 116 removed by the CMP process is between about 0.1 μm and about 10 μm. In some embodiments, the resulting thickness of the second passivation layer 116 over the unetched portion of the RDL 112 is between about 400 nm and about 1.5 nm in order to reduce stress on the underlying layers and maintain affordable materials cost, however the thickness is not limited thereto. In various embodiments, the second passivation layer 116 has a thickness above the un-etched portion of the RDL 112 that is about 40% or more of the thickness of the unetched portion of the RDL 112. In various embodiments, a ratio of the thickness of the second passivation layer 116 to the thickness of the unetched portion of the RDL 112 is between about 0.4 and about 2, such as between about 0.6 and about 1.5 or between about 0.5 and 0.8. In some embodiments, the thickness of the second passivation layer 116 above the unetched portion of the RDL 112 is substantially equal to the thickness of the unetched portion of the RD 112. In some embodiments, the thickness of the second passivation layer 116 above the unetched portion of the RDL 112 is greater than the thickness of the unetched portion of the RDL 112.

In various embodiments, the second passivation layer 116 comprises more than one coextensive overlying layers. In some embodiments, the multiple layers of the second passivation layer 116 are composed of like materials, including the materials described herein above. In some embodiments, the second passivation layer 116 is composed of a first layer having a thickness between 0.1 nm and 10 μm and a second layer having a thickness between 0.1 nm and 10 μm.

In various embodiments, as a result of deposition of the second passivation layer 116 in the trenches 113 of the RDL 112, one or more gaps 116a and 116b are formed in the top surface of the second passivation layer 116. In various embodiments, the second passivation layer 116 has a sufficient thickness such that gaps 116a and 116b do not extend into trenches 113, 113a after deposition. In some embodiments, the gaps 116a and 116b are of a depth that cannot be smoothed by planarization techniques, such as CMP, alone. Accordingly, in various embodiments, a third passivation layer 118, such as a USG layer or material similar to first and second passivation layers, is disposed on the top surface of the second passivation layer 116 including within the one or more gaps 116a and 116b.

Figure 3:
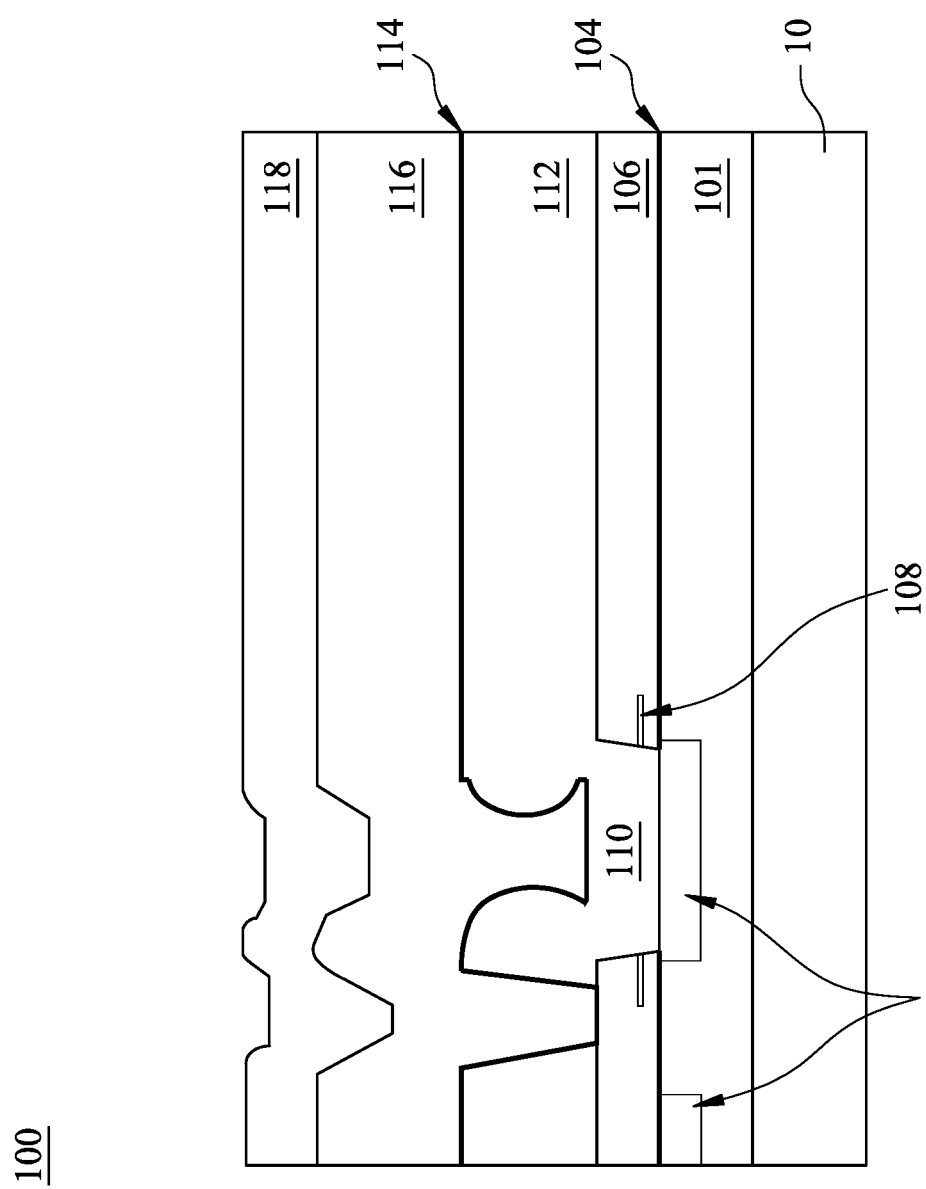
FIG. 3 is a cross-sectional view of one of various stages of a sequential fabrication process of a semiconductor device according to some embodiments.

FIG. 3 is a cross-sectional view of a subsequent stage of a sequential fabrication process of the semiconductor device 100 according to various embodiments, in which the USG layer 118 is deposited on the top surface of the second passivation layer 116, and within the gaps 116a and 116b, before a CMP process is used on the top surface of the second passivation layer 116. In some embodiments, a thickness of the USG layer is between about 0.1 nm to about 10 μm, and is between about 0.5 μm to about 2 μm in other embodiments.

Figure 4:
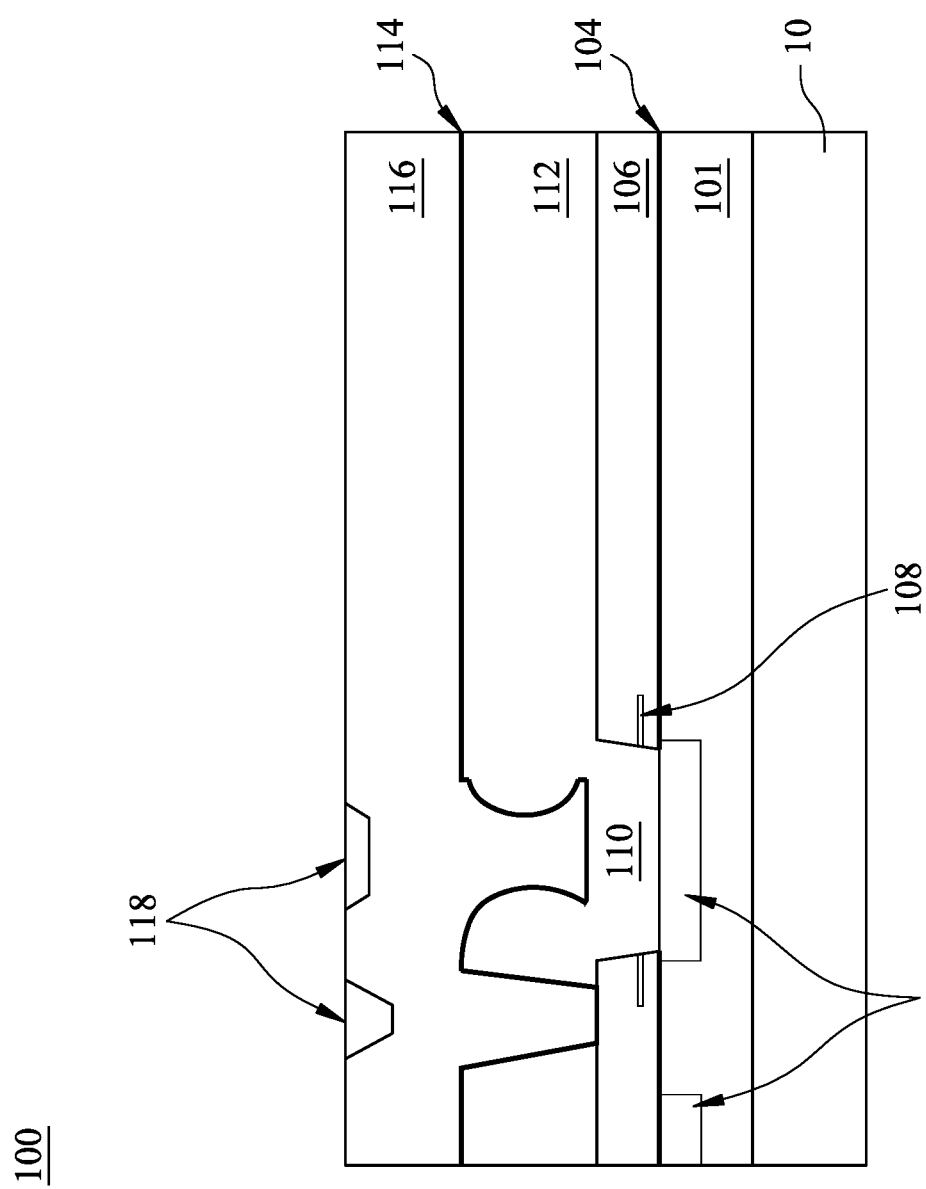
FIG. 4 is a cross-sectional view of one of various stages of a sequential fabrication process of a semiconductor device according to some embodiments.

FIG. 4 is a cross-sectional view of a subsequent stage of a sequential fabrication process of the semiconductor device 100 according to various embodiments, in which the USG layer 118 is removed (i.e., etched back or CMP operations), such that the only remaining USG layer 118 is within the gaps 116a and 116b. In such embodiments, the top surface of the remaining USG layer 118 is coplanar with the top surface of the second passivation layer 116. The CMP process is then used to planarize the top surface of the second passivation layer 116 and the remaining USG layer 118. In various embodiments, after the CMP process, the range of evenness (i.e., the difference between the highest point and the lowest point) of a cross-section of the top surface of the second passivation layer 116 is between around 0.02 μm and about 1 μm, which is far superior to what could be achieved with thinner passivation layers.

Figure 5:
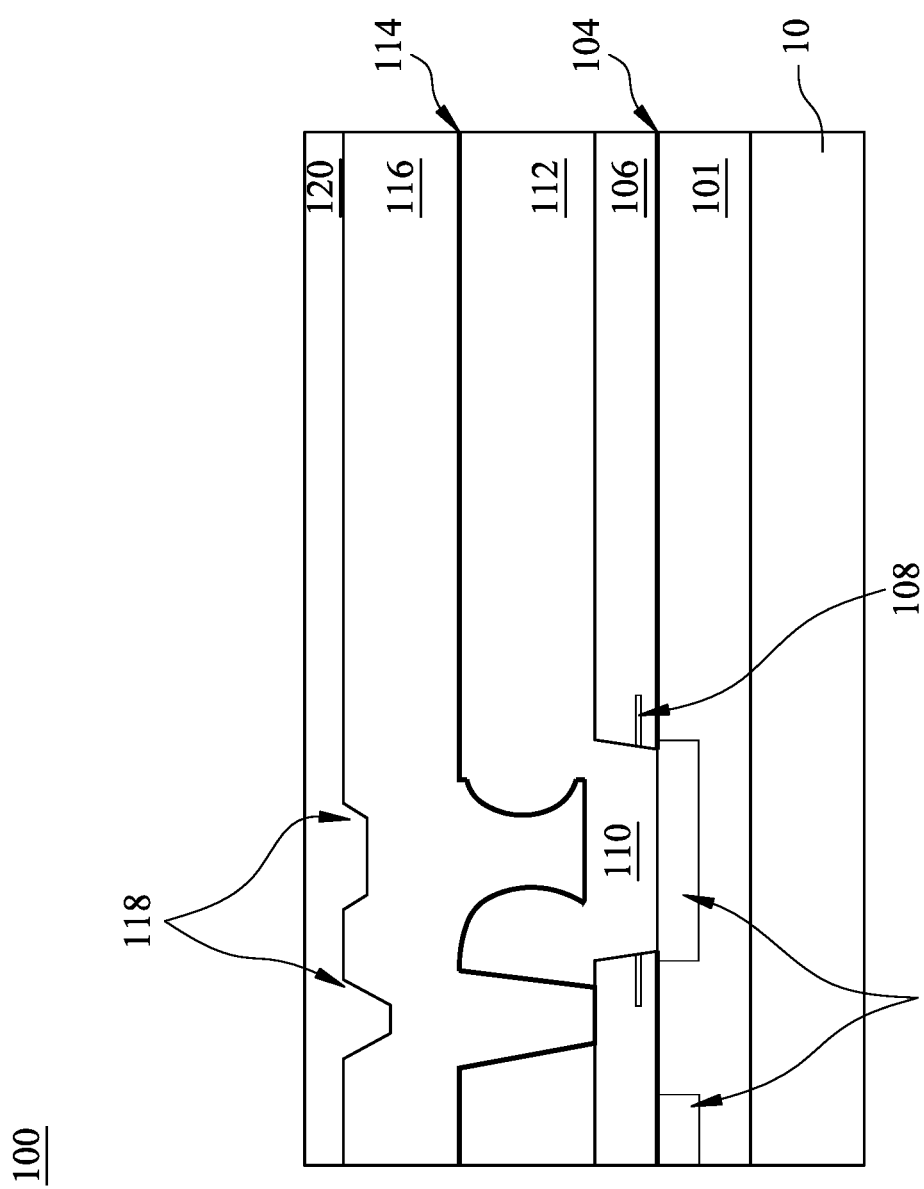
FIG. 5 is a cross-sectional view of one of various stages of a sequential fabrication process of a semiconductor device according to some embodiments.

FIG. 5 is a cross-sectional view of a subsequent stage of a sequential fabrication process of the semiconductor device 100 according to various embodiments, in which a second silicon nitride layer 120 as a fourth passivation layer is deposited and disposed on the top surface of the second passivation layer 116, including the remaining USG layer 118 within the gaps 116a and 116b. In some embodiments, the second silicon nitride layer 120 protects the underlying layers in the same manner as the ESL layer 114. In some embodiments, a thickness of the second silicon nitride layer is between about 100 nm to about 1 μm, and is between about 200 nm to about 500 nm in other embodiments.

Figure 6:
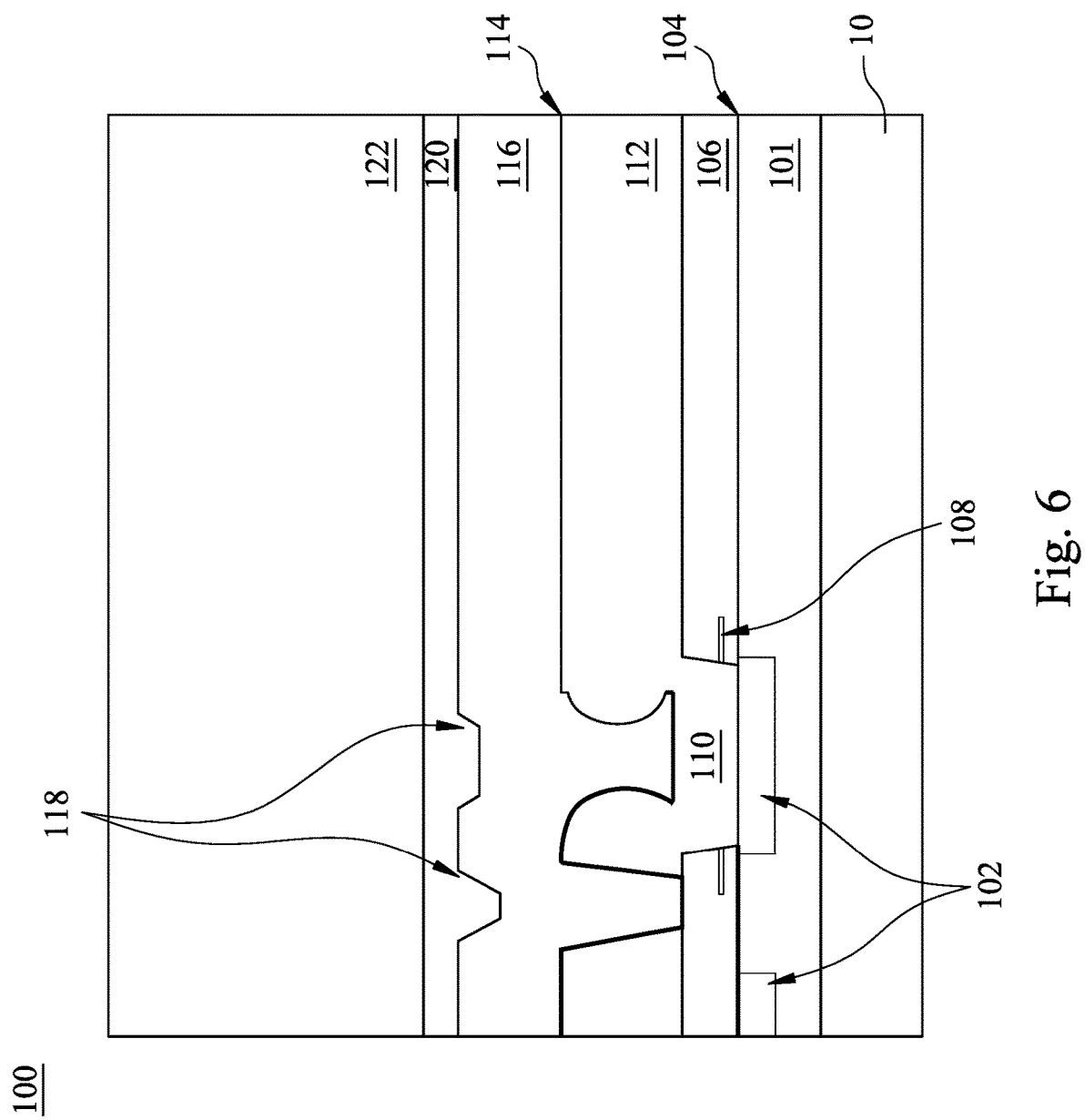
FIG. 6 is a cross-sectional view of one of various stages of a sequential fabrication process of a semiconductor device according to some embodiments.

FIG. 6 is a cross-sectional view of a subsequent stage of a sequential fabrication process of the semiconductor device 100 according to various embodiments, in which a polyimide layer 122 is deposited and disposed on the second silicon nitride layer 120 in order to provide the resulting semiconductor device 100 as a useful semiconductor package.

Figure 7:
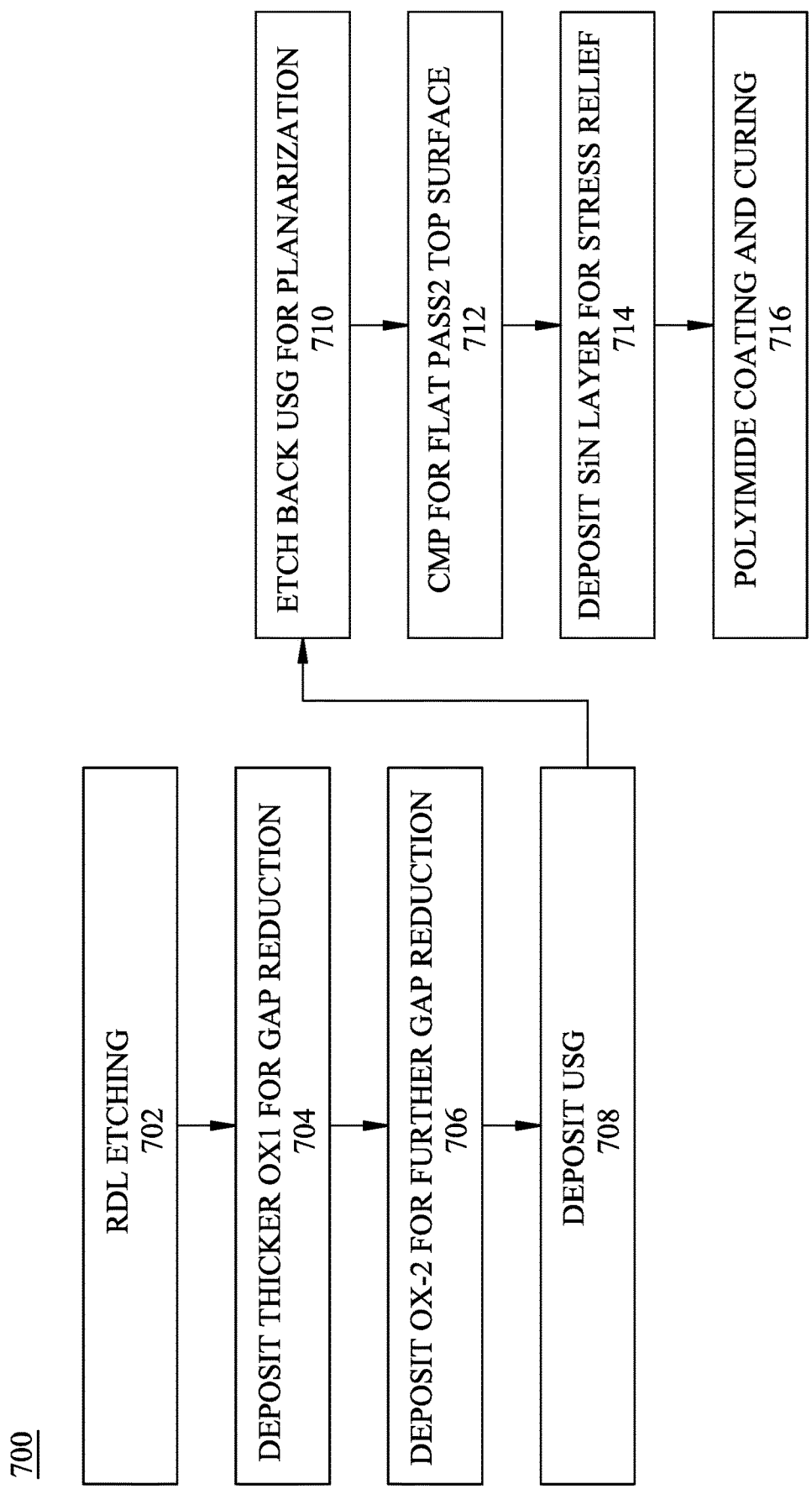
FIG. 7 is a flowchart of a semiconductor manufacturing process according to some embodiments.

FIG. 7 is a flowchart of a semiconductor manufacturing process 700 for manufacturing the completed semiconductor device 100 according to various embodiments. In various embodiments, at operation 702, the RDL 112 is etched to form trenches 113 as previously described. In some embodiments, an RV 110 is disposed under an etched portion of the RDL. In some embodiments, an ESL 114 is disposed over the etched and unetched portions of the RDL 112. Next, at operation 704, a thicker second passivation layer 116 is deposited above the RDL 112 on the ESL 114 in order to achieve gap reduction in a top surface thereof. In some embodiments, the second passivation layer 116 may be provided as two coextensive layers in order to achieve further gap reduction (operation 706). Next, at operation 708, a USG layer 118 is deposited on the top surface of the second passivation layer 116 as previously described above. Next, at operation 710, the USG layer 118 is etched back so that only the portions thereof that remain in gaps 116a and 116b of the top surface of the second passivation layer 116 remain.

Next, at operation 712, a CMP process is used to smooth and planarize the top surface of the second passivation layer 116 including the remaining portions of the USG layer 118. The resulting smoothness of the top surface is between about 0.2 μm and 1 μm, which alleviates stress on the underlying layers.

Next, at operation 714, a second silicon nitride layer 120 is deposited on the top surface of the second passivation layer 116 in order to provide protection of the underlying layers and to provide further stress relief. Finally, at operation 716, a polyimide layer 122 is deposited on the second silicon nitride layer 120 and a curing of the polyimide layer 122 is performed to complete the manufacturing process 700 of the semiconductor device 100.

Figure 8:
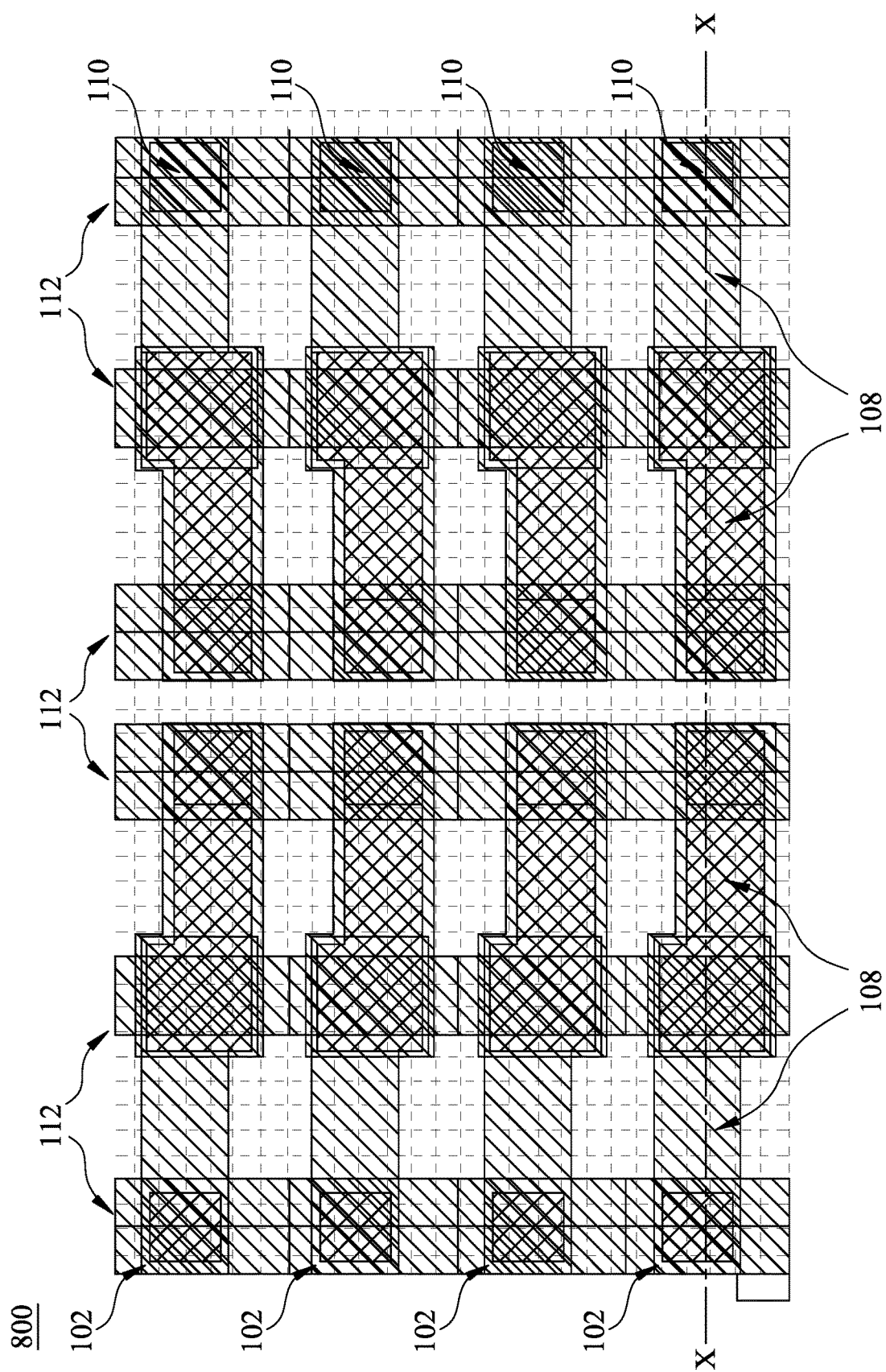
FIG. 8 is a top view (layout) of a semiconductor device according to some embodiments.

FIG. 8 is a top view 800 of a layout of multiple copies of the semiconductor device 100 according to some embodiments, where various TM layers 102, RDL layers 112, RVs 110 and MIM capacitors 108 and trenches 113 and 113a are shown in relation to one another. A portion of the cross-sectional line X-X as shown corresponds to the cross-sectional view shown in the remaining Figures.

In various embodiments, computer simulations project that stress produced by the thicker and planarized second passivation layer 116 is about 31% of prior manufacturing techniques using thinner passivation layers. In various embodiments, it is projected that stress on the underlying first passivation layer is about 4% of prior manufacturing techniques using thinner passivation layers.

This disclosure introduces methods and apparatus for manufacturing a semiconductor device 100 that results in improved stress relief of the underlying layers typically caused by unevenness of the etched RDL layer 112. The solutions described herein provide little impact or change to existing manufacturing processes and are beneficial to both boosting device yield and relaxing MIM KOZ rules. Although described primarily with respect to capacitor devices, the solutions herein are likewise useful in the manufacture of SoIC packages because the bonding interface between the upper and bottom dies thereof are required to be flat.

According to various embodiments, a semiconductor device includes a dielectric layer disposed over a substrate and having a top surface; a top metal layer disposed within a portion of the dielectric layer and extending to the top surface of the dielectric layer; and a first passivation layer disposed above the top surface of the dielectric layer. In such embodiments, a redistribution layer (RDL) is disposed on the first passivation layer. In such embodiments, the RDL has an un-etched portion of a first thickness. In such embodiments, a second passivation layer is disposed above the RDL, and has a second thickness over the un-etched portion of the RDL that is at least about 40% or more of the first thickness. In some embodiments, the first thickness is between 1 μm and 5 μm, and second thickness is between 0.4 μm and 10 μm. In some embodiments, a material of the RDL comprises at least one of: aluminum, copper, gold, tungsten, iron, titanium, tantalum, cobalt, tin and germanium. In some embodiments, a silicon nitride layer is disposed between the dielectric layer and the first passivation layer. In some embodiments, an etch stop layer (ESL) layer is disposed between the redistribution layer and the second passivation layer. In some embodiments, an undoped silicate glass is disposed within one or more gaps in a top surface of the second passivation layer. In some embodiments, a silicon nitride layer is disposed on the top surface of the second passivation layer and the undoped silicate glass. In some embodiments, a polyimide layer is disposed on the silicon nitride layer. In some embodiments, a metal-insulator-metal (MIM) capacitor is disposed within the first passivation layer. In some embodiments, a via having a contact metal disposed therein extends through the first passivation layer and the MIM capacitor, to contact the top metal layer under an etched portion of the RDL. In some embodiments, the first passivation layer includes at least two layers. In some embodiments, the second passivation layer includes at least two layers. In some embodiments, a cross-section of a top surface of second passivation layer has a smoothness between a highest point and a lowest point that ranges between about 0.02 micrometers and about 1 micrometer.

According to various embodiments, a method of manufacturing a semiconductor device includes the following sequential or non-sequential operations: (i) depositing a silicon nitride layer on a top metal layer and on a dielectric layer disposed over a substrate; (ii) depositing a first passivation layer over the silicon nitride layer; (iii) depositing a redistribution layer (RDL) over the first passivation layer, the RDL having a first thickness over the first passivation layer; (iv) etching a portion of the RDL; (v) depositing an etch stop layer (ESL) layer over the RDL; and (vi) depositing a second passivation layer over the ESL, the second passivation layer having a second thickness over an un-etched portion of the RDL that is between 40% of and twice the first thickness. In some embodiments, depositing the first passivation layer further includes: (i) depositing a first layer of undoped silicate glass over the first silicon nitride layer; (ii) depositing a metal insulator metal (MIM) capacitor over a portion of the first layer of undoped silicate glass; and (iii) depositing a second layer of undoped silicate glass over the first layer of undoped silicate glass and on the MIM capacitor. In some embodiments, the first layer of undoped silicate glass, the metal insulator metal capacitor and the second layer of undoped silicate glass together form the first passivation layer. In some embodiments, a via positioned under the portion of the RDL is etched so as to extend through an underlying portion of the first passivation layer and an underlying portion of the silicon nitride layer to the top metal layer; and a contact metal is deposited within the via. In some embodiments, the contact metal is composed of the material as the RDL and electrically connects the MIM capacitor, the top metal layer and the RDL. In some embodiments, a third layer of undoped silicate glass is deposited over a top surface of the second passivation layer; a portion of the third layer is then removed such that the undoped silicate glass only remains within any gaps in the top surface of the second passivation layer; and the top surface of the third layer and the top surface of the second passivation layer are planarized after said removing so that a smoothness of a cross-section of the top surface of the second passivation layer (i.e., between a highest and a lowest point) is between about 0.02 micrometers (um) and about 1 μm. In some embodiments, a second silicon nitride layer is deposited over the top surface of the second passivation layer; and a polyimide layer is deposited over the second silicon nitride layer.

According to various embodiments, a method of forming a semiconductor device includes: (i) providing a top metal layer that extends to a top surface of a dielectric layer over a substrate; (ii) providing a first silicon nitride layer over the top metal layer and the top surface of the dielectric layer; (iii) providing a first passivation layer over the first silicon nitride layer; (iv) providing a redistribution layer over the first passivation layer; (v) providing an etch stop layer over the redistribution layer; (vi) providing a second passivation layer over the etch stop layer, where a ratio of a thickness of the second passivation layer to a thickness of the redistribution layer is between about 0.4 and about 2; (vii) providing a layer of undoped silicate glass over a portion of the second passivation layer; (viii) providing a second silicon nitride layer over the second passivation layer and the layer of undoped silicate glass; and (ix) providing a polyimide layer over the second silicon nitride layer. In some embodiments, the method further includes providing a contact metal within a via disposed between the top metal layer and the redistribution layer through the first passivation layer, and providing a metal-insulator-metal capacitor within the first passivation layer and in contact with the contact metal.

The foregoing outlines features of several embodiments or examples so that those skilled in the art better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device comprising:
   depositing a silicon nitride layer over a top metal layer and a dielectric layer disposed over a substrate;
   depositing a first passivation layer over the silicon nitride layer;
   depositing a redistribution layer (RDL) over the first passivation layer, the RDL having a first thickness over the first passivation layer;
   etching a portion of the RDL;
   depositing an etch stop layer (ESL) layer over the RDL; and
   depositing a second passivation layer over the ESL, the second passivation layer having a second thickness over an un-etched portion of the RDL that is between 40% of and twice the first thickness,
   depositing a third layer of undoped silicate glass over a top surface of the second passivation layer; and
   removing a portion of the third layer such that the undoped silicate glass only remains within any gaps in the top surface of the second passivation layer.

2. The method of claim 1, wherein depositing the first passivation layer further comprises:
   depositing a first layer of undoped silicate glass over the first silicon nitride layer;
   depositing a metal insulator metal (MIM) capacitor over a portion of the first layer of undoped silicate glass; and
   depositing a second layer of undoped silicate glass over the first layer of undoped silicate glass and on the MIM capacitor, where the first layer of undoped silicate glass, the metal insulator metal capacitor and the second layer of undoped silicate glass together form the first passivation layer.

3. The method of claim 1, further comprising:
   forming a via positioned under the portion of the RDL that is etched and extending through an underlying portion of the first passivation layer and an underlying portion of the silicon nitride layer to the top metal layer; and
   depositing a contact metal within the via, the contact metal comprising a material of the RDL that electrically connects the MIM capacitor, the top metal layer and the RDL.

4. The method of claim 1, further comprising:
   planarizing a top surface of the third layer and the top surface of the second passivation layer after said removing so that a smoothness of a cross-section of the top surface of the second passivation layer is between 0.02 micrometers (um) and 1 μm.

5. The method of claim 1, further comprising:
   depositing a second silicon nitride layer over the top surface of the second passivation layer; and
   depositing a polyimide over the second silicon nitride layer.

6. A method of manufacturing a semiconductor device, comprising:
   providing a top metal layer that extends to a top surface of a dielectric layer;
   providing a first silicon nitride layer over the top metal layer and the top surface of the dielectric layer;
   providing a first passivation layer over the first silicon nitride layer;
   providing a redistribution layer over the first passivation layer;
   providing an etch stop layer over the redistribution layer;
   providing a second passivation layer over the etch stop layer, where a ratio of a thickness of the second passivation layer to a thickness of the redistribution layer is between 0.4 and 2;
   providing a layer of undoped silicate glass over a portion of the second passivation layer;
   removing a portion of the undoped glass such that the undoped silicate glass only remains within any gaps in the top surface of the second passivation layer,
   providing a second silicon nitride layer over the second passivation layer and the layer of undoped silicate glass; and
   providing a polyimide layer over the second silicon nitride layer.

7. The method of claim 6, further comprising:
   providing a contact metal within a via disposed between the top metal layer and the redistribution layer through the first passivation layer; and
   providing a metal-insulator-metal capacitor within the first passivation layer and in contact with the contact metal.

8. The method of claim 7, wherein metal-insulator-metal capacitor includes at least two conductive plates, and each plate is separated by a dielectric insulating layer.

9. The method of claim 8, wherein the metal-insulator-metal capacitor is comprised of at least one selected from the group consisting of titanium nitride (TiN), titanium (Ti), aluminum (Al), indium tin oxide (ITO), tungsten (W), tungsten nitride (WN), tantalum nitride (TaN), tantalum (Ta), rhenium trioxide (ReO$_3$), rhenium oxide (ReO$_2$), iridium oxide (IrO$_2$), ruthenium (Ru), osmium (Os), palladium (Pd), platinum (Pt), copper (Cu), molybdenum nitride (MoN), and molybdenum (Mo).

10. The method of claim 6, wherein providing the first passivation layer over the first silicon nitride layer further comprises:
    depositing a first layer of undoped silicate glass over the first silicon nitride layer;
    depositing a metal insulator metal capacitor over a portion of the first layer of undoped silicate glass; and
    depositing a second layer of undoped silicate glass over the first layer of undoped silicate glass and on the MIM capacitor, where the first layer of undoped silicate glass, the metal insulator metal capacitor and the second layer of undoped silicate glass together form the first passivation layer.

11. The method of claim 10, wherein the first layer of undoped silicate glass has a thickness of between 200 nm and 300 nm.

12. The method of claim 10, wherein the second layer of undoped silicate glass has a thickness of between 550 nm and 750 nm.

13. The method of claim 6, wherein the top metal layer has a top surface that is coextensive and coplanar with the top surface of the dielectric layer.

14. The method of claim 6, wherein the silicon nitride layer has a thickness of from 10 nm to 300 nm.

15. The method of claim 4, wherein the undoped silicate glass layer has a thickness of from 0.1 nm to 10 μm.

16. The method of claim 6, wherein the etch stop layer has a thickness of from 0.2 nm to 2 μm.

17. A method of manufacturing a semiconductor device, comprising:
    forming a top metal layer that extends to a top surface of a dielectric layer;
    forming a first silicon nitride layer over the top metal layer and the top surface of the dielectric layer;
    forming a first passivation layer over the first silicon nitride layer;
    forming a redistribution layer over the first passivation layer;
    forming a second passivation layer over the redistribution layer, where a ratio of a thickness of the second passivation layer to a thickness of the redistribution layer is between 0.4 and 2;
    forming a layer of undoped silicate glass over a portion of the second passivation layer; and
    removing a portion of the undoped silicate glass such that the undoped silicate glass only remains within any gaps in the top surface of the second passivation layer
    forming a second silicon nitride layer over the second passivation layer and the layer of undoped silicate glass.

18. The method of claim 17, further comprising:
    forming an etch stop layer over the redistribution layer, wherein the etch stop layer has a thickness of from 0.2 nm to 2 μm.

19. The method of claim 18, wherein the etch stop layer is comprised of at least one selected from the group consisting of silicon oxynitride (SiO$_x$N$_y$), silicon carbonitride (SiCN), silicon oxycarbide (SiOC), silicon carbide (SiC), silicon oxycarbonitride (SiOCN), and silicon nitride (Si$_x$N$_y$).

20. The method of claim 17, further comprising:
    forming a polyimide layer over the second silicon nitride layer.

* * * * *